(12) United States Patent
Philipp et al.

(10) Patent No.: US 7,457,146 B2
(45) Date of Patent: Nov. 25, 2008

(54) MEMORY CELL PROGRAMMED USING A TEMPERATURE CONTROLLED SET PULSE

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/455,340

(22) Filed: Jun. 19, 2006

(65) Prior Publication Data

US 2007/0297221 A1    Dec. 27, 2007

(51) Int. Cl.
*G11C 11/00* (2006.01)
(52) U.S. Cl. .................. 365/148; 365/218; 365/221
(58) Field of Classification Search .......... 365/163, 365/175, 113, 230.06, 225.7
See application file for complete search history.

(56) References Cited

U.S. PATENT DOCUMENTS

| | | | |
|---|---|---|---|
| 3,530,441 A * | 9/1970 | Ovshinsky | 365/113 |
| 5,296,716 A * | 3/1994 | Ovshinsky et al. | 257/3 |
| 6,075,719 A | 6/2000 | Lowrey et al. | |
| 6,487,113 B1 * | 11/2002 | Park et al. | 365/163 |
| 6,512,241 B1 * | 1/2003 | Lai | 257/4 |
| 6,625,054 B2 * | 9/2003 | Lowrey et al. | 365/148 |
| 6,687,153 B2 | 2/2004 | Lowrey | |
| 6,759,267 B2 | 7/2004 | Chen | |
| 6,768,665 B2 * | 7/2004 | Parkinson et al. | 365/113 |
| 7,012,834 B2 * | 3/2006 | Cho et al. | 365/163 |
| 7,042,760 B2 * | 5/2006 | Hwang et al. | 365/163 |
| 7,085,154 B2 * | 8/2006 | Cho et al. | 365/163 |
| 2004/0246804 A1 | 12/2004 | Cho et al. | |
| 2004/0246808 A1 | 12/2004 | Cho et al. | |
| 2005/0117387 A1 | 6/2005 | Hwang et al. | |
| 2005/0117388 A1 | 6/2005 | Cho et al. | |

FOREIGN PATENT DOCUMENTS

| | | |
|---|---|---|
| KR | 20050046771 | 5/2005 |
| WO | 2004025659 A1 | 3/2004 |

OTHER PUBLICATIONS

S. Lal et al., "OUM-A 180 nm Nonvolatile Memory Cell Element Technology For Stand Alone And Embedded Applications," 4 pgs., IEDM 2001.
Lai, Stefan, "Current Status Of The Phase Change Memory And Its Future," pp. 10.1.1-10.1.4, IEDM 2003.
H. Horii et al., "An Edge Contact Type Cell For Phase Change RAM Featuring Very Low Power Consumption," 2 pgs., VLSI, 2003.

(Continued)

*Primary Examiner*—Zandra Smith
*Assistant Examiner*—Paul E Patton
(74) *Attorney, Agent, or Firm*—Dicke, Billig & Czaja, PLLC

(57) ABSTRACT

A memory device includes a phase change memory cell and a circuit. The circuit is for programming the memory cell to a selected one of more than two states by applying a temperature controlled set pulse to the memory cell.

23 Claims, 6 Drawing Sheets

OTHER PUBLICATIONS

ECD Ovonics, Research Report, Ovonic Unified Memory, 80 pgs., http://www.ovonics.com/PDFs/Elec Memory Research Report/OUM.pdf, 1999.

H. Horii et al., "A Novel Cell Technology Using N-Doped GeSbTe Films For Phase Change RAM," 2 pgs., VLSI, 2003.

Y.N. Hwant, et al., "Full Integration And Reliability Evaluation Of Phase-Change RAM Based On 0.24 μm-CMOS Technologies," 2 pgs., VLSI, 2003.

Jeong et al., "Switching Current Scaling And Reliability Evaluation In Pram," pp. 28-29, NVSMW, 2004.

G. Atwood et al., http://www.intel.com/design/flash/isf/overview.pdf, 8 pgs., 1997.

T. Sakamoto et al., "A Nonvolatile Programmable Solid Electrolyte Nanometer Switch," 10 pgs., ISSCC, 2004.

H.R. Oh et al., "Enhanced Write Performance Of A 64Mb Phase Change RAM," 3 pgs., ISSCC, 2005.

T. Lowrey et al., "Characteristics Of OUM Phase Change Memory Materials And Devices For High Density Nonvolitile Commodity And Embedded Memory Applications," 7 pgs., MRS Sump. Proc. 803, 101, 2004.

Korean Office Action for Korean Application No. 10-2007-0059789 mailed May 30, 2008 (4 pages).

* cited by examiner

MEMORY CELL PROGRAMMED USING A TEMPERATURE CONTROLLED SET PULSE

BACKGROUND

One type of memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material in the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states. Cells in such intermediate states have a resistance that lies between the fully crystalline state and the fully amorphous state. If the phase change memory cell is programmed to one of three different resistance levels, 1.5 bits of data per cell can be stored. If the phase change memory cell is programmed to one of four different resistance levels, two bits of data per cell can be stored, and so on. For simplicity, the description in this disclosure is substantially focused on four different resistance levels or states and two bits of data per cell. This is for illustrative purposes only, however, and not intended to limit the scope of the invention. In principle it is possible to store three or more states.

To program a phase change memory cell to an intermediate resistance value, the amount of crystalline material coexisting with amorphous material and hence the cell resistance is controlled via a suitable write strategy. The amount of crystalline material coexisting with amorphous material should be precisely controlled to ensure consistent resistance values for multi-bit storage. Consistent resistance values having a narrow distribution of the different resistance levels ensure that a sufficient sensing margin can be obtained.

For these and other reasons, there is a need for the present invention.

SUMMARY

One embodiment of the present invention provides a memory device. The memory device includes a phase change memory cell and a circuit. The circuit is for programming the memory cell to a selected one of more than two states by applying a temperature controlled set pulse to the memory cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
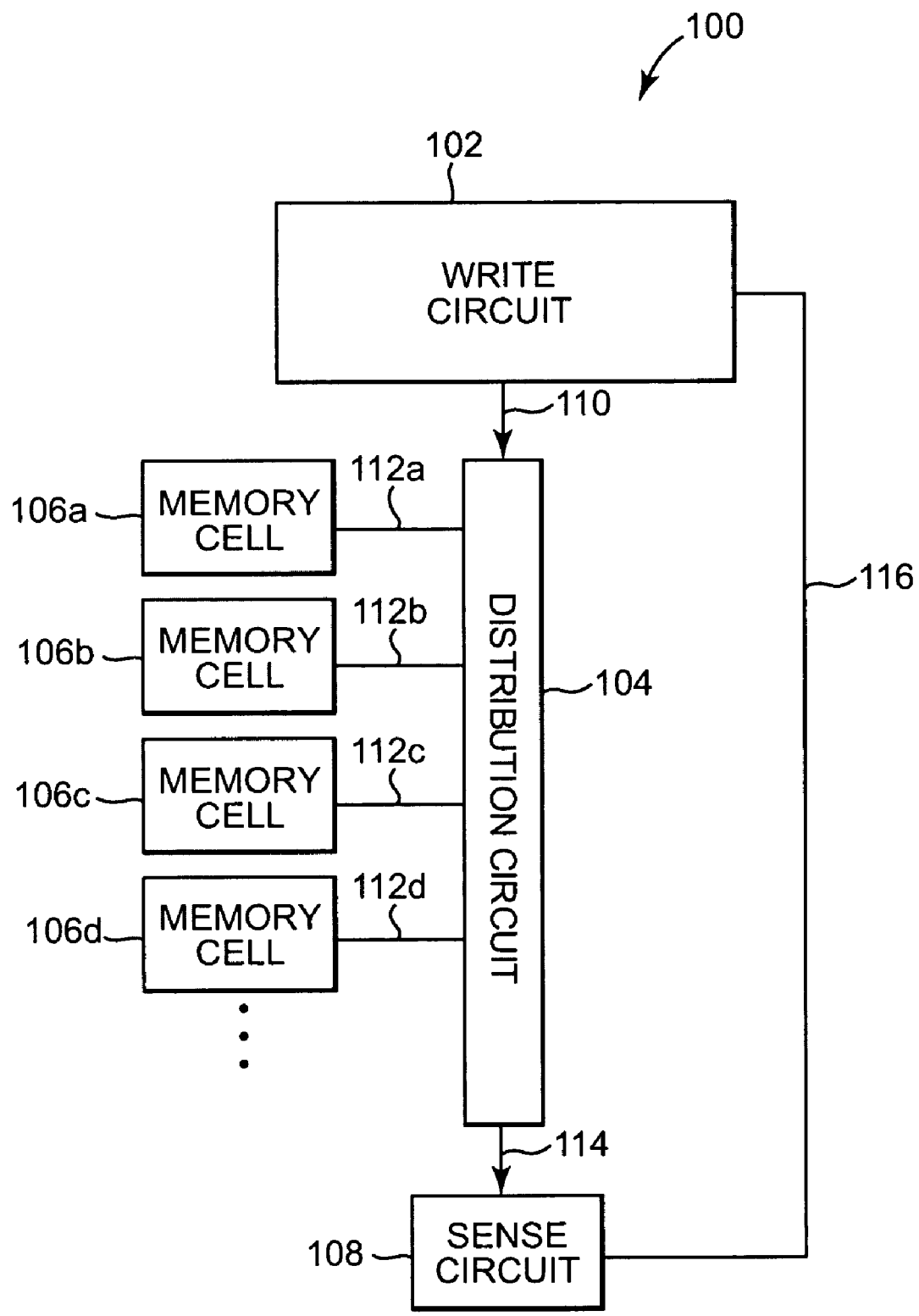
FIG. 1 is a block diagram illustrating one embodiment of a memory device.

FIG. 1 is a block diagram illustrating one embodiment of a memory device 100. Memory device 100 includes a write circuit 102, a distribution circuit 104, memory cells 106a, 106b, 106c, and 106d, and a sense circuit 108. Each of the memory cells 106a-106d is a phase change memory cell that stores data based on the amorphous and crystalline states of phase change material in the memory cell. Also, each of the memory cells 106a-106d can be programmed into more than two states by programming the phase change material to have intermediate resistance values. To program one of the memory cells 106a-106d to an intermediate resistance value, the amount of crystalline material coexisting with amorphous material—and hence the cell resistance—is controlled via a suitable write strategy.

Memory device 100 is configured to program memory cells 106a-106d by controlling the amount of crystallized material by monitoring the memory cell temperature and/or resistance. At the correct temperature, the amount of crystallized phase change material can be controlled by time. In addition, the phase change memory cell resistance provides an indication of the memory cell temperature. Therefore, by controlling the length of a write pulse at a specified temperature as measured by the resistance of the memory cell, each phase change memory cell 106a-106d is programmed to a selected state of more than two possible states.

As used herein, the term "electrically coupled" is not meant to mean that the elements must be directly coupled together and intervening elements may be provided between the "electrically coupled" elements.

Write circuit 102 is electrically coupled to distribution circuit 104 through signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. In addition, distribution circuit 104 is electrically coupled to sense circuit 108 through signal path 114, and sense circuit 108 is electrically coupled to write circuit 102 through signal path 116.

Each of the memory cells 106a-106d includes phase change material (i.e., a phase change element) that may be changed from an amorphous state to a crystalline state or from a crystalline state to an amorphous state under the influence of temperature change. The amount of crystalline material coexisting with amorphous material in the phase change material of one of the memory cells 106a-106d thereby defines more than two states for storing data within memory device 100. In the amorphous state, a phase change material exhibits significantly higher resistivity than in the crystalline state. Therefore, the more than two states of memory cells 106a-106d differ in their electrical resistivity. In one embodiment, the more than two states can be three states and a trinary system can be used, wherein the three states are assigned bit values of "0", "1", and "2". In one embodiment, the more than two states are four states that can be assigned multi-bit values, such as "00", "01", "10", and "11". In other embodiments, the more than two states can be any suitable number of states in the phase change material of a memory cell.

Write circuit 102 provides pulses to memory cells 106a-106d and programs one of the more than two resistance levels or states into the phase change material of each of the memory cells 106a-106d. In one embodiment, write circuit 102 provides voltage pulses to distribution circuit 104 through signal path 110 and distribution circuit 104 controllably directs the voltage pulses to memory cells 106a-106d through signal paths 112a-112d. In one embodiment, distribution circuit 104 includes a plurality of transistors that controllably direct voltage pulses to each of the memory cells 106a-106d. In other embodiments, write circuit 102 provides current pulses to distribution circuit 104 through signal path 110 and distribution circuit 104 controllably directs the current pulses to memory cells 106a-106d through signal paths 112a-112d.

Sense circuit 108 senses the state of each memory cell and provides signals that indicate the state of the resistance of each memory cell. Sense circuit 108 reads each of the more than two states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In operation of one embodiment, write circuit 102 resets the phase change material in a target memory cell 106a-106d. A reset operation includes heating the phase change material of the target memory cell above its melting temperature and quickly cooling the phase change material to thereby achieve a substantially amorphous state. This amorphous state is one of the more than two states of each of the memory cells 106a-106d and is the highest resistance state.

From the amorphous state, write circuit 102 programs a selected one of the more than two states into the target memory cell. Write circuit 102 provides a signal to the target memory cell to crystallize part of the phase change material and thereby lower the resistance of the target memory cell.

In operation of another embodiment, write circuit 102 sets the phase change material in a target memory cell 106a-106d. A set operation includes heating the phase change material of the target memory cell above its crystallization temperature (but usually below its melting temperature) to thereby achieve a substantially crystalline state. This crystalline state is one of the more than two states of each of the memory cells 106a-106d and is the lowest resistance state.

From the crystalline state, write circuit 102 programs a selected one of the more than two states into the target memory cell. Write circuit 102 provides a signal to the target memory cell to transition a portion of the phase change material to an amorphous state and thereby raise the resistance of the target memory cell.

Figure 2:
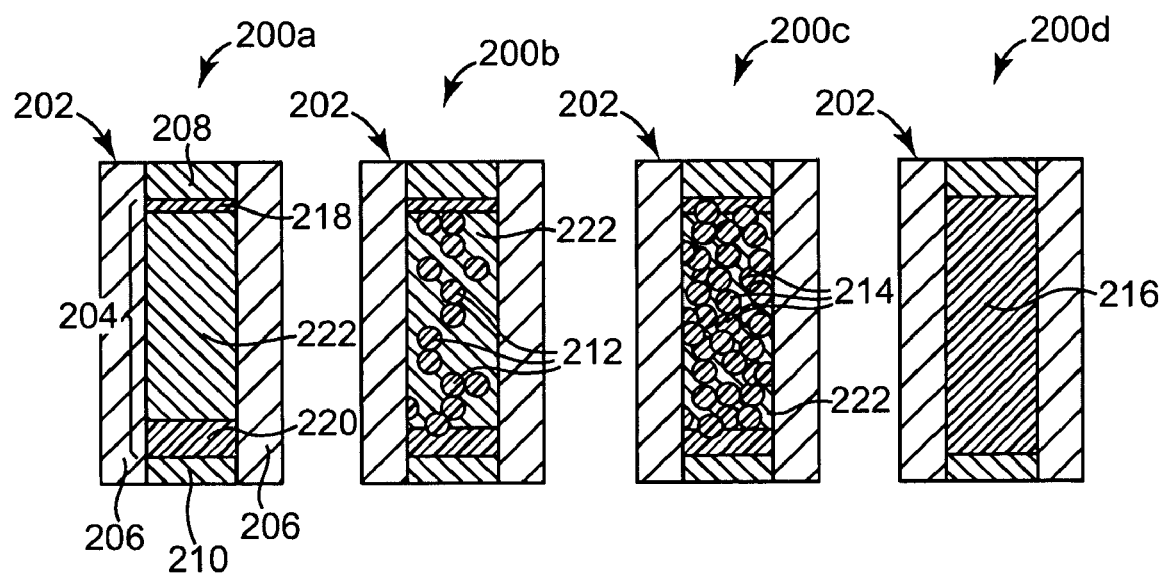
FIG. 2 is a diagram illustrating one embodiment of a memory cell in four different states.

FIG. 2 is a diagram illustrating one embodiment of a memory cell 202 in four different states at 200a, 200b, 200c, and 200d. Memory cell 202 includes a phase change material 204 that is situated in insulation material 206. In other embodiments, memory cell 202 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to memory cell 202 via first electrode 208 and second electrode 210. The current path through phase change material 204 is from one of the first electrode 208 and second electrode 210 to the other one of the first electrode 208 and second electrode 210. In one embodiment, each of the memory cells 106a-106d is similar to memory cell 202. Memory cell 202 provides a storage location for storing bits of data.

Insulation material 206 can be any suitable insulator, such as $SiO_2$, fluorinated silica glass (FSG), or boro-phosphorous silicate glass (BPSG). First electrode 208 and second electrode 210 can be any suitable electrode material, such as TiN, TaN, W, Al, Ti, Ta, TiSiN, TaSiN, TiAlN, TaAlN, or Cu.

Phase change material 204 may be made up of a variety of materials in accordance with the present invention. Generally, chalcogenide alloys that contain one or more elements from group VI of the periodic table are useful as such materials. In one embodiment, phase change material 204 of memory cell 202 is made up of a chalcogenide compound material, such as GeSbTe, SbTe, GeTe, or AgInSbTe. In another embodiment, phase change material 204 is chalcogen free, such as GeSb, GaSb, InSb, or GeGaInSb. In other embodiments, phase change material 204 is made up of any suitable material including one or more of the elements Ge, Sb, Te, Ga, As, In, Se, and S.

Phase change material 204 is programmed into one of four states to store two bits of data. A selection device, such as an active device like a transistor or diode, is coupled to first electrode 208 to control the application of pulses to phase change material 204. The pulses reset phase change material 204 and program one of the other three states into phase change material 204. At 200b, a small fraction 212 of phase change material 204 has been programmed to change the resistance through phase change material 204 and memory cell 202. At 200c, a medium sized fraction 214 of phase change material 204 has been programmed to change the resistance through phase change material 204 and memory cell 202. At 200d, a large fraction 216, which is substantially all of phase change material 204, has been programmed to change the resistance through phase change material 204 and memory cell 202.

The size of the programmed fraction is related to the resistance through phase change material 204 and memory cell 202. The three different phase change fractions at 200b-200d plus the initial state at 200a provide four states in phase change material 204, and memory cell 202 provides a storage location for storing two bits of data. In one embodiment, the state of memory cell 202 at 200a is a "00", the state of memory cell 202 at 200b is a "01", the state of memory cell 202 at 200c is a "10", and the state of memory cell 202 at 200d is a "11".

At 200a, phase change material 204 is reset to a substantially amorphous state. During a reset operation of memory cell 202, a reset pulse is selectively enabled by the selection device and sent through first electrode 208 and phase change material 204. The reset pulse heats phase change material 204 above its melting temperature and phase change material 204 is quickly cooled to achieve the substantially amorphous state at 200a. After a reset operation, phase change material 204 includes crystalline state phase change material at 218 and 220, and amorphous state phase change material at 222. The substantially amorphous state at 200a is the highest resistance state of memory cell 202.

To program phase change material 204 into one of the other three states 200b-200d, a temperature controlled set pulse is provided via a write circuit, such as write circuit 102. At 200b, a temperature controlled set pulse is provided to program the small volume fraction 212 into a crystalline state. The crystalline state is less resistive than the amorphous state and memory cell 202 at 200b has a lower resistance than memory cell 202 in the substantially amorphous state at 200a. The partially crystalline and partially amorphous state at 200b is the second highest resistance state of memory cell 202.

At 200c, a temperature controlled set pulse is provided to program the medium volume fraction 214 into a crystalline state. Since the crystalline fraction 214 is larger than the crystalline faction 212 and the crystalline state is less resistive than the amorphous state, memory cell 202 at 200c has a lower resistance than memory cell 202 at 200b and memory cell 202 in the amorphous state at 200a. The partially crystalline and partially amorphous state at 200c is the second lowest resistance state of memory cell 202.

At 200d, a temperature controlled set pulse is provided to program substantially all of the phase change material 216 into the crystalline state. Since the crystalline state is less resistive than the amorphous state, memory cell 202 at 200d has a lower resistance than memory cell 202 at 200c, memory cell 202 at 200b, and memory cell 202 in the amorphous state at 200a. The substantially crystalline state at 200d is the lowest resistance state of memory cell 202. In other embodiments, memory cell 202 can be programmed into any suitable number of resistance values or states. In other embodiments, memory cell 202 can be set to a substantially crystalline state and reset pulses can be used to program memory cell 202 to the desired resistance value or state.

Figure 3:
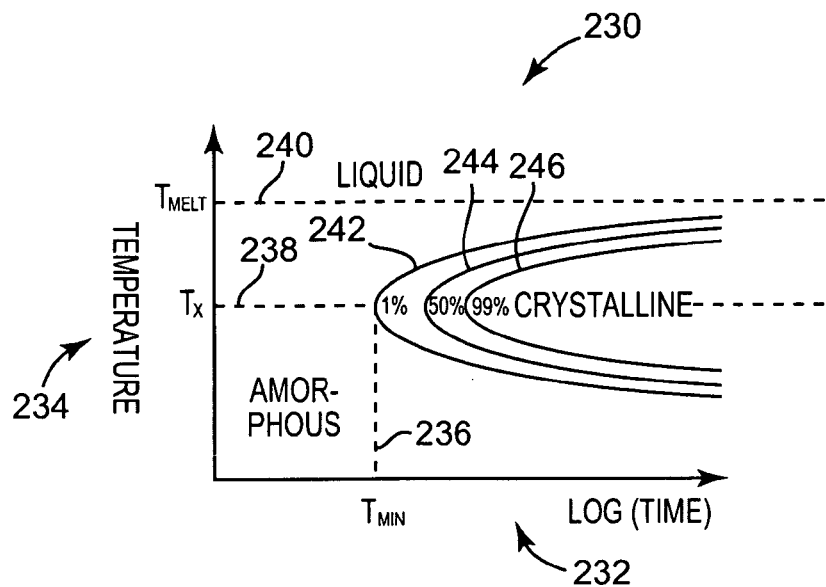
FIG. 3 is a graph illustrating one embodiment of the crystallization of phase change material based on temperature and time.

FIG. 3 is a graph 230 illustrating one embodiment of the crystallization of phase change material based on temperature and time. Graph 230 includes the log of time on x-axis 232 and temperature on y-axis 234. At a temperature $T_{MELT}$ indicated at 240, the phase change material liquefies. At a temperature $T_X$ indicated at 238 up until a minimum time ($T_{MIN}$) indicated at 236, the phase change material remains amorphous. After $T_{MIN}$ at 236, the phase change material begins to crystallize. After a first period as indicated at 242, approximately 1% of the phase change material is crystallized. After a second period as indicated at 244, approximately 50% of the phase change material is crystallized, and after a third period as indicated at 246, approximately 99% of the phase change material is crystallized. Therefore, by controlling the temperature of the phase change material and the length of time at that temperature, the amount of crystallized phase change material can be controlled.

Figure 4:
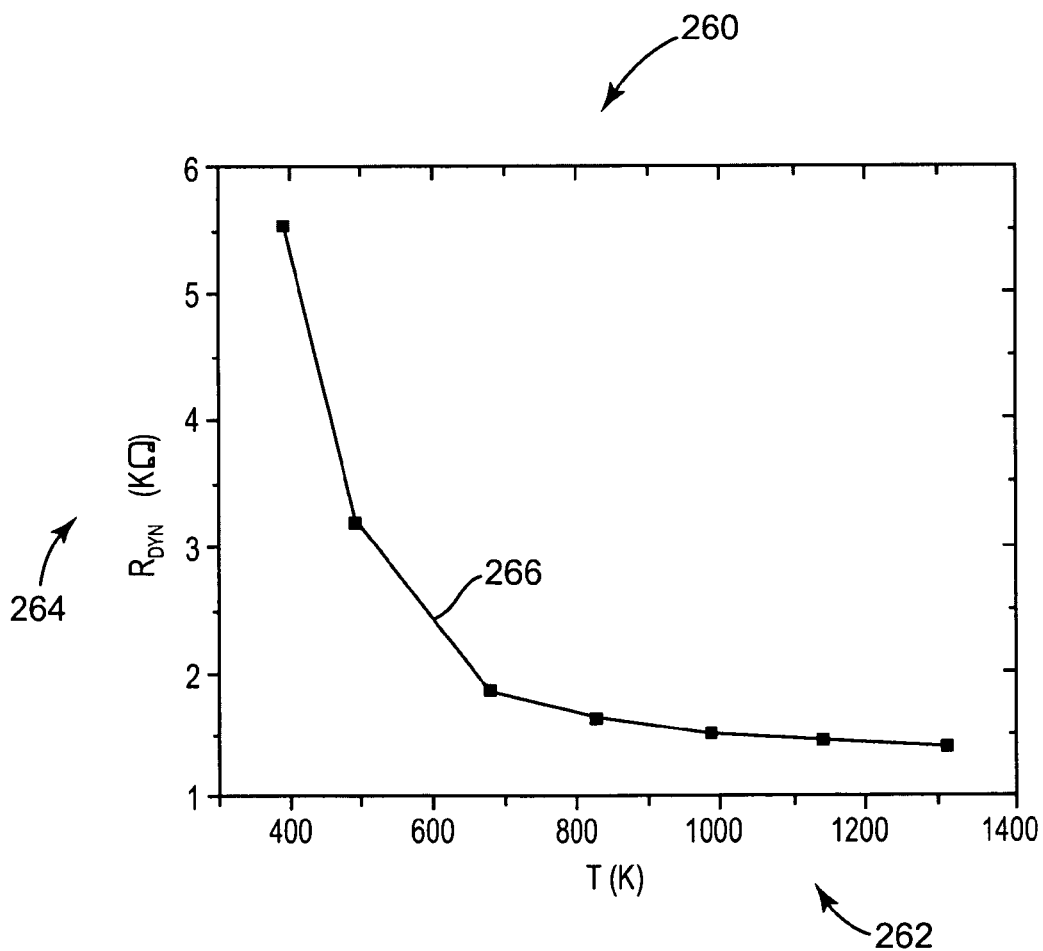
FIG. 4 is a graph illustrating one embodiment of the relationship between resistance and temperature for phase change material.

FIG. 4 is a graph 260 illustrating one embodiment of the relationship between resistance and temperature for phase change material. Graph 260 includes temperature in Kelvin (K) on x-axis 262 and resistance in kiloohms (kΩ) on y-axis 264. The relationship between the temperature of the phase change material during programming and the resistance is illustrated by curve 266. At low programming temperatures, such as 400 K, the resistance of the phase change material is approximately 5.6 kΩ. At higher programming temperatures, such as 1000 K, the resistance of the phase change material is approximately 1.5 kΩ. Therefore, by determining the resistance of the phase change material during programming, the temperature of the phase change material can be determined.

Figure 5:
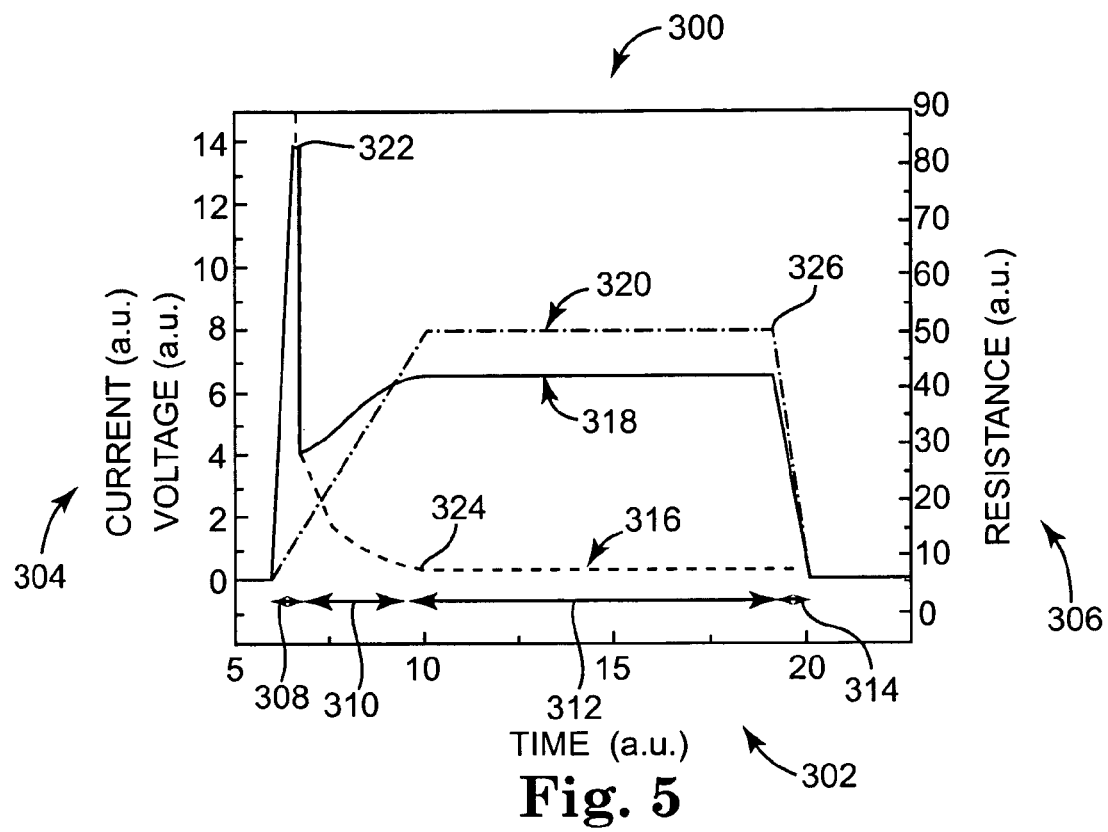
FIG. 5 is a graph illustrating one embodiment of a temperature controlled set pulse for programming a phase change memory cell.

FIG. 5 is a graph 300 illustrating one embodiment of a temperature controlled set pulse for programming a phase change memory cell. Graph 300 includes time on x-axis 302, current and voltage on axis 304, and resistance on axis 306. Voltage versus time is indicated by curve 318, current versus time is indicated by curve 320, and resistance verses time is indicated by curve 316.

The temperature controlled set pulse includes four phases indicated at 308, 310, 312, and 314. In the first phase at 308, a small current is applied to a memory cell to reach the threshold voltage of the phase change material as indicated at 322 of voltage curve 318. In the second phase at 310, the current is increased until the desired temperature of the memory cell is reached. In one embodiment, the temperature is determined by monitoring the resistance of the memory cell. The desired temperature as indicated by the resistance is reached at 324 of resistance curve 316.

In the third phase at 312, the current and voltage applied to the memory cell are maintained at constant values for a set period to crystallize a desired portion of the phase change material. The desired portion of phase change material crystallized determines the programmed state of the memory cell. In the fourth phase at 314, the desired portion of phase change material has been crystallized. At 326, the current is ramped down to zero. In this way, the phase change memory cell is programmed to a desired state based on the temperature of the phase change material and the length of the write pulse in the third phase at 312.

In one embodiment, write circuit 102 includes a current pulse generator to provide a current pulse on a bit line coupled to a selected memory cell. In this embodiment, the bit line current and the bit line voltage are monitored to determine the memory cell resistance and hence the temperature of the memory cell. In another embodiment, write circuit 102 includes a voltage source to apply a voltage to a bit line coupled to a selected memory cell. In addition, a voltage is applied to a word line, which controls an access device coupled to the selected memory cell, to provide a current pulse from the access device to the selected memory cell. In this embodiment, the word line and bit line voltages are monitored to determine the memory cell resistance and hence the temperature of the memory cell. In other embodiments, other methods of generating the current pulse are used. In any case, the current pulse is temperature controlled to program the selected memory cell to a desired resistance state.

Figure 6:
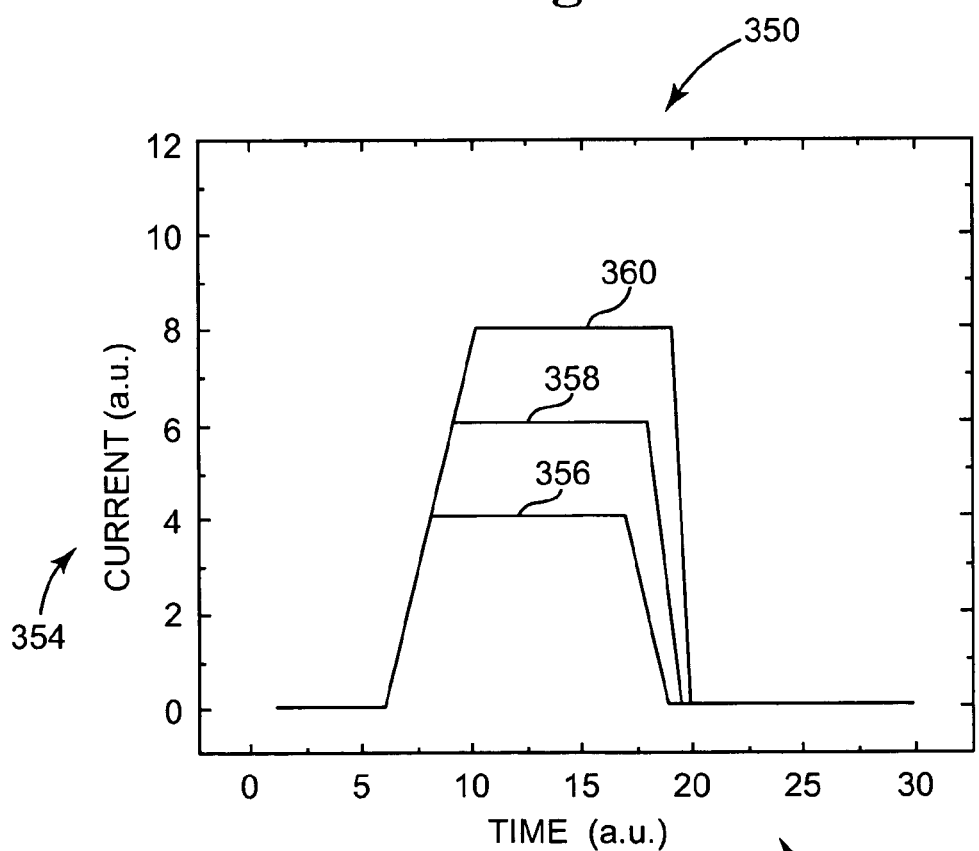
FIG. 6 is a graph illustrating one embodiment of temperature controlled set pulses for programming a phase change memory cell to one of multiple states.

FIG. 6 is a graph 350 illustrating one embodiment of temperature controlled set pulses for programming a phase change memory cell to one of multiple states. Graph 350 includes time on x-axis 352 and current on y-axis 354. Temperature controlled set pulse 356 programs a memory cell to a first state such as state 200b of memory cell 202 illustrated in FIG. 2. Temperature controlled set pulse 358, which provides a greater current than temperature controlled set pulse 356, programs a memory cell to a second state, such as state 200c of memory cell 202 illustrated in FIG. 2. Temperature controlled set pulse 360, which provides a greater current than temperature controlled set pulse 358, programs a memory cell to a third state, such as state 200d of memory cell 202 illustrated in FIG. 2. Temperature controlled set pulses 356, 358, and 360 all have the same pulse length but they have different target temperatures and hence current level plateaus for programming a memory cell to different states.

Figure 7:
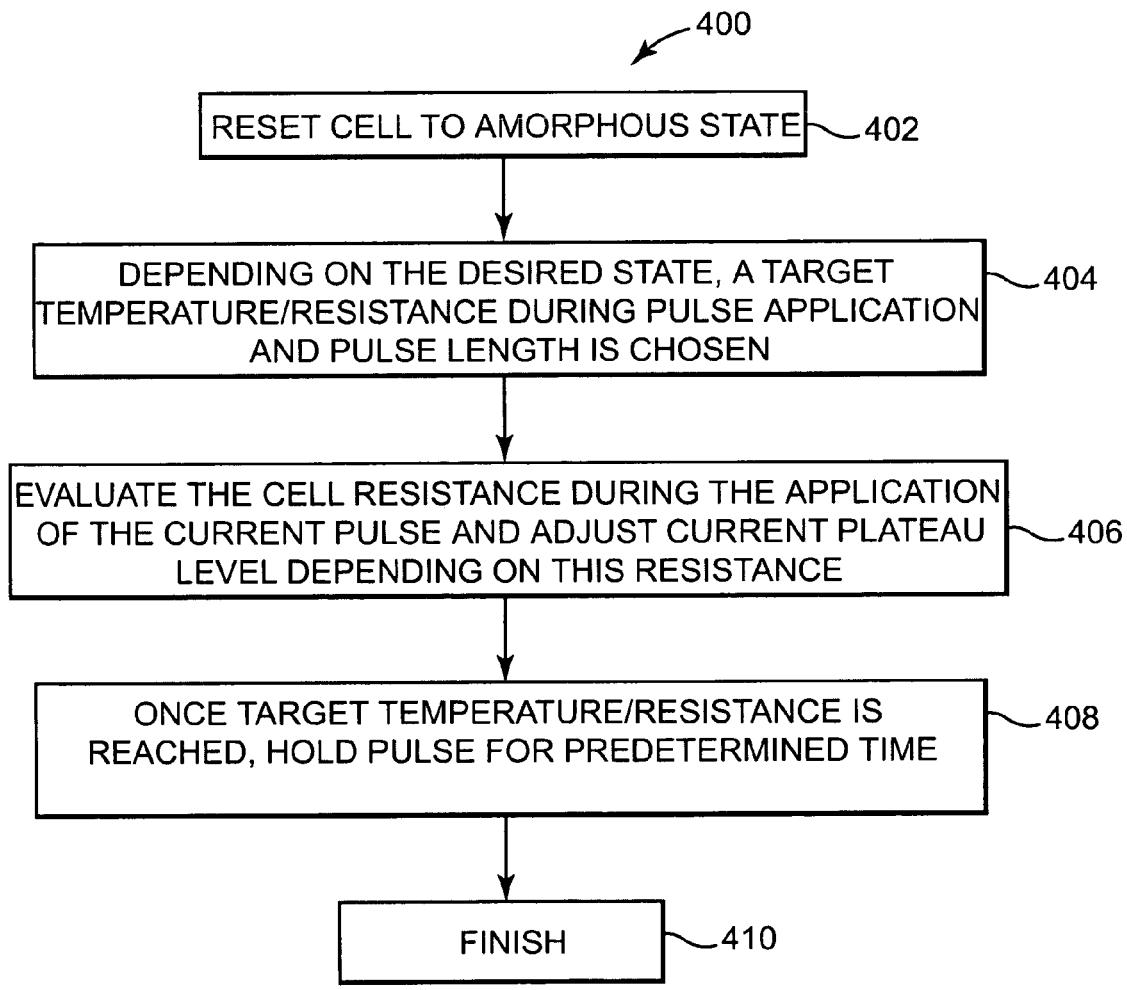
FIG. 7 is a flow diagram illustrating one embodiment of a method for programming a phase change memory cell.

FIG. 7 is a flow diagram illustrating one embodiment of a method 400 for programming a phase change memory cell. At 402, write circuit 102 resets a selected memory cell 106a-106d to an amorphous state or substantially amorphous state, such as the substantially amorphous state 200a of memory cell 202 illustrated in FIG. 2. At 404, depending on the desired state of the memory cell, a target temperature/resistance to maintain during the pulse application and a pulse length is selected. At 406, the memory cell resistance is evaluated during the application of the current pulse and the current pulse plateau level is adjusted based on the resistance. At 408, once the target resistance/temperature is reached, the pulse is held for a predetermined time to program the phase change memory cell to the desired state. At 410, the pulse is shut off and the programming of the memory cell is finished.

Figure 8:
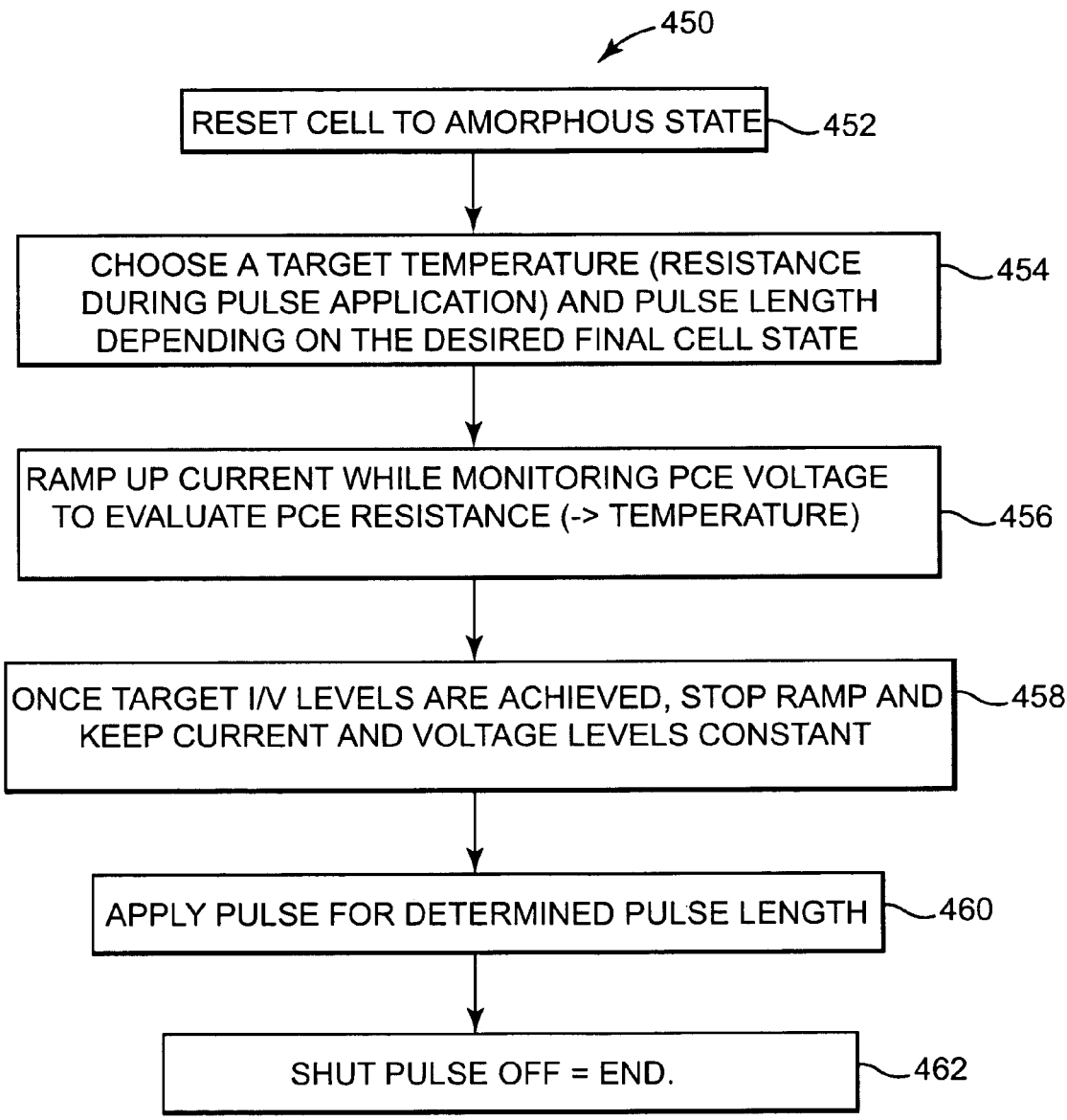
FIG. 8 is a flow diagram illustrating another embodiment of a method for programming a phase change memory cell.

FIG. 8 is a flow diagram illustrating another embodiment of a method 450 for programming a phase change memory cell. At 452, write circuit 102 resets a selected memory cell 106a-106d to an amorphous state or substantially amorphous state, such as the substantially amorphous state 200a of memory cell 202 illustrated in FIG. 2. At 454, depending on the desired state of the memory cell, a target temperature to maintain during the pulse application and a pulse length is selected. At 456, the current is ramped up while monitoring the phase change element (PCE) voltage of the memory cell to evaluate the phase change element resistance. The resistance of the phase change element provides an indication of the temperature of the phase change element. At 458, once the target current and voltage levels are achieved, the ramp up of the current is stopped and the current and voltage levels are maintained at constant levels. At 460, the pulse is applied for the predetermined pulse length to program the phase change memory cell to the desired state. At 462, the pulse is shut off and the programming of the memory cell is complete.

Embodiments of the present invention provide a temperature controlled set pulse for programming a phase change memory cell to one of more than at least two resistance level or states. The temperature controlled set pulse is based on the temperature of the memory cell as determined by monitoring the resistance of the memory cell during the set pulse and on a crystallization time of the memory cell at that temperature. In this way, precise control over the programming of memory cells to intermediate resistance values for multi-bit storage applications is possible.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory device comprising:
   a phase change memory cell; and
   a circuit for monitoring a resistance of the memory cell for detecting the memory cell temperature and for programming the memory cell to a selected one of more than two states having resistances different from the monitored resistance by applying a temperature controlled set pulse to the memory cell, the temperature controlled set pulse based on the detected temperature of the memory cell as indicated by the monitored resistance;
   wherein the temperature controlled set pulse comprises applying a current to the memory cell, ramping up the current and leveling the current in response to the monitored resistance reaching a desired value, maintaining the current level for a set period to set the memory cell to the selected state, and ramping down the current once the set period has elapsed.

2. The memory of claim 1, wherein the temperature controlled set pulse comprises applying the current to the memory cell to reach a threshold voltage of the memory cell.

3. The memory of claim 1, wherein the set period comprises a crystallization time of the memory cell at the desired value.

4. The memory of claim 1, wherein the phase change memory cell comprises one of Ge, Sb, Te, Ga, As, In, Se, and S.

5. An integrated circuit comprising:
a phase change memory cell; and
a circuit for monitoring a resistance of the memory cell to detect the memory cell temperature and for programming the memory cell to a selected state of more than two possible states,
wherein the circuit programs the memory cell by applying a current to the memory cell, thereby ramping up the current and leveling the current in response to the resistance reaching a desired value, maintaining the current level for a set period to set the memory cell to the selected state, and ramping down the current once the set period has elapsed.

6. The integrated circuit of claim 5, wherein the circuit monitors the resistance of the memory cell based on a voltage across the memory cell.

7. The integrated circuit of claim 5, wherein the desired value is based on the selected state.

8. The integrated circuit of claim 5, wherein the set period comprises a crystallization time of the memory cell at the desired value.

9. The integrated circuit of claim 5, wherein the phase change memory cell comprises one of Ge, Sb, Te, Ga, As, In, Se, and S.

10. A memory comprising:
a phase change memory cell for storing at least 1.5 data bits; and
means for programming the memory cell using a temperature controlled set pulse comprising:
means for ramping up a current of the set pulse;
means for monitoring a resistance of the memory cell to detect the memory cell temperature and leveling the current in response to the resistance reaching a desired value;
means for maintaining the current level for a set period to set the memory cell to a desired state; and
means for ramping down the current once the set period has elapsed.

11. The memory of claim 10, wherein the means for programming the memory cell using the temperature controlled set pulse further comprises:
means for reaching a threshold voltage of the memory cell.

12. The memory of claim 10, wherein the set period comprises a crystallization time of the memory cell at the desired value.

13. The memory of claim 10, wherein the phase change memory cell comprises one of Ge, Sb, Te, Ga, As, In, Se, and S.

14. A method for programming a phase change memory cell, the method comprising:
resetting the memory cell to an amorphous state;
applying a current to the memory cell;
ramping up the current applied to the memory cell;
monitoring a resistance of the memory cell to detect the memory cell temperature and leveling the current in response to the resistance reaching a desired value;
maintaining the current level for a set period to set the memory cell to the desired state; and
ramping down the current once the set period has elapsed.

15. The method of claim 14, wherein applying the current to the memory cell comprises applying the current to the memory cell to reach a threshold voltage of the memory cell.

16. The method of claim 14, wherein maintaining the current level for a set period comprises maintaining the current level for a crystallization time of the memory cell.

17. The method of claim 14, wherein applying the current to the memory cell comprises applying the current to a bit line coupled to the memory cell, and wherein monitoring the resistance of the memory cell comprises determining the memory cell resistance based on the current and a bit line voltage.

18. The method of claim 14, wherein applying the current to the memory cell comprises applying a first voltage to a bit line coupled to the memory cell and applying a second voltage to a word line of an access device coupled to the memory cell to provide the current, and wherein monitoring the resistance of the memory cell comprises determining the memory cell resistance based on the first voltage and the second voltage.

19. A method for programming a phase change memory cell, the method comprising:
resetting the memory cell to an amorphous state;
applying a current to the memory cell;
ramping up the current applied to the memory cell;
monitoring a voltage across the memory cell and leveling the current in response to the voltage and current reaching desired values indicating that the memory cell is at a desired temperature;
maintaining the current and voltage for a set period to set the memory cell to the desired state; and
ramping down the current once the set period has elapsed.

20. The method of claim 19, wherein applying the current to the memory cell comprises applying the current to the memory cell to reach a threshold voltage of the memory cell.

21. The method of claim 19, wherein maintaining the current and voltage for the set period comprises maintaining the current and voltage for a crystallization time of the memory cell.

22. The method of claim 19, wherein applying the current to the memory cell comprises applying the current to a bit line coupled to the memory cell.

23. The method of claim 19, wherein applying the current to the memory cell comprises applying a first voltage to a bit line coupled to the memory cell and applying a second voltage to a word line of an access device coupled to the memory cell to provide the current.

* * * * *